United States Patent [19]

Fujimoto et al.

[11] Patent Number: 5,087,590
[45] Date of Patent: Feb. 11, 1992

[54] METHOD OF MANUFACTURING SEMICONDUCTOR DEVICES

[75] Inventors: Hitoshi Fujimoto; Hisao Masuda; Shuichi Osaka, all of Itami; Noriaki Uwagawa, Kikuchi, all of Japan

[73] Assignee: Mitsubishi Denki Kabushiki Kaisha, Japan

[21] Appl. No.: 426,004

[22] Filed: Oct. 24, 1989

[30] Foreign Application Priority Data

Jun. 28, 1989 [JP] Japan .................................. 1-163664

[51] Int. Cl.$^5$ .............................................. H01L 21/60
[52] U.S. Cl. .................................... 437/209; 437/210; 437/220; 148/DIG. 17; 361/421; 428/620
[58] Field of Search ................. 437/209, 206, 207, 210, 437/217, 220, 225, 949; 29/842; 148/DIG. 17, 22; 361/421; 428/620

[56] References Cited

U.S. PATENT DOCUMENTS

| | | | |
|---|---|---|---|
| 4,732,733 | 3/1988 | Sakamoto et al. | 357/67 R |
| 4,894,752 | 1/1990 | Muraya et al. | 357/70 |

FOREIGN PATENT DOCUMENTS 61-18138  1/1986  Japan .
61-24242  2/1986  Japan .

OTHER PUBLICATIONS

"VLSI & GaAs Chip Packaging Workshop", Sep. 12-14, 1988, p. 8.

Primary Examiner—Olik Chaudhuri
Assistant Examiner—Andrew Griffis
Attorney, Agent, or Firm—Leydig, Voit & Mayer

[57] ABSTRACT

With a method of and an apparatus for manufacturing semiconductor devices using copper-type lead frames with no silver plating, semiconductor devices are continuously manufactured in the following steps: first, a semiconductor pellet having electrodes on its surface is bonded, through a resin material, to a die pad on a copper-alloy lead frame which is not silver-plated. The resin material used for the bonding is then cured by heating it for 120 seconds or less in a non-oxidizing-gas atmosphere having an oxygen density of 1000 ppm or less. Then, the thickness of the oxide film which is formed on the surface of the lead frame while curing the resin material is reduced to 20 Å or less by keeping the lead frame in a deoxidizing-gas atmosphere having an oxygen density of 500 ppm or less. Afterwards, wirebonding is effected between the electrodes of the semiconductor pellet and the inner leads of the lead frame in 12 seconds or less in a deoxidizing-gas atmosphere while keeping the oxygen density around the surface of the lead frame at 3000 ppm or less.

12 Claims, 10 Drawing Sheets

F I G. 15
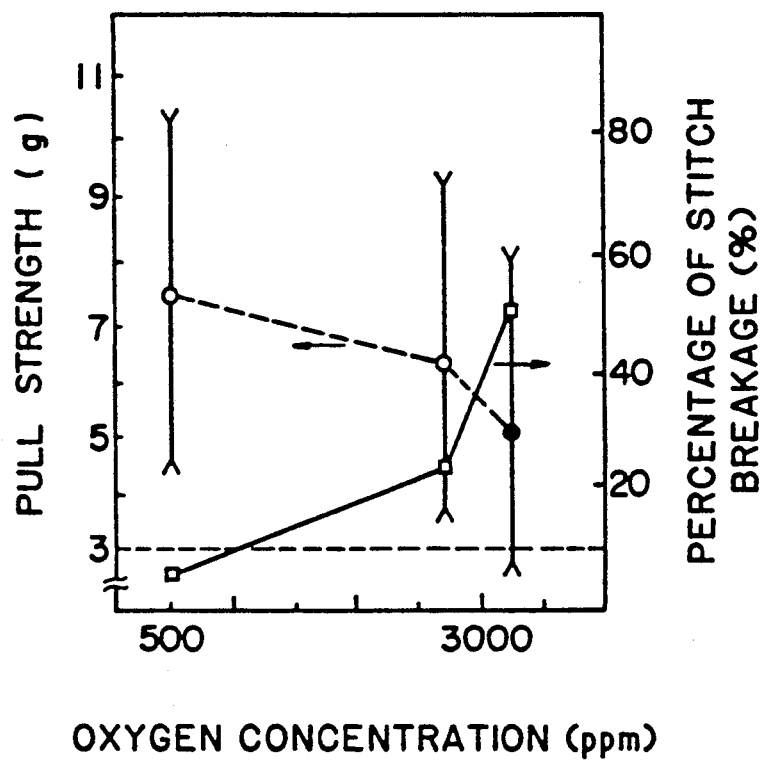

METHOD OF MANUFACTURING SEMICONDUCTOR DEVICES

BACKGROUND OF THE INVENTION

1. Field Of The Invention

This invention relates to a method of and an apparatus for manufacturing semiconductor devices and, in particular, to a method of and apparatus for manufacturing semiconductor devices using copper lead frames with no silver plating.

2. Description Of The Related Art

FIGS. 6 and 7 show a conventional plastic package semiconductor device. The device shown includes a copper alloy lead frame 2 having a die pad 3, inner leads 6, and outer leads 8. The die pad 3 and the inner leads 6 are plated with silver 10. A semiconductor pellet 1 is attached to the silver plating 10 of the die pad 3 by means of a die bonding material 4. The semiconductor pellet 1 has electrodes 5 respectively connected to the inner leads 6 of the lead frame 2 through bonding wires 7 made of gold or the like having a diameter of 25 to 50μm. One end of each wire 7 is ball bonded to one of the electrodes 5 on the semiconductor pellet 1 and the other end of each wire is stitched to the silver plating 10 on the surface of the corresponding lead 6. The semiconductor pellet 1, the die pad 3, and inner leads 6 of the lead frame 2, as well as the wires 7, are encapsulated by a resin 9 with only the outer leads 8 exposed.

The bonding of the wires 7 is performed using a capillary tip 11 as shown in FIG. 8. In the stitch bonding section S in FIG. 7, the wire 7 is pressed against the surface of the inner lead 6 with the tip end of the capillary tip 11 and is thereby deformed. Afterwards, the section is heated, causing mutual diffusion of the metals in the bonding section. FIG. 9 is a plan view showing the stitch bonding section S when the bonding has been completed.

The reason for plating the surfaces of the inner leads 6 of the lead frame 2 with silver 10 is as follows. As shown in FIG. 10, silver is less likely to oxidize than aluminum, the main material of the lead frame 2. Thus, by plating the surfaces of the inner leads 6 with silver 10, stitch bonding can be easily performed while heating the bonding section in the air, there being no fear that the surfaces of the inner leads 6 will be oxidized.

However, with the recent trend toward very dense semiconductor devices, the number of electrodes 5 on the semiconductor pellet 1 has increased. At the same time, the package has become more compact and, as a consequence, the distance between adjacent inner leads 6 has become as small as 0.4 mm or less. Thus, when, under high temperature and humidity, voltage is applied to the semiconductor device in order to operate it, electromigration occurs between the inner leads 6 plated with silver which can lead to an electrical short circuit. Furthermore, silver plating increases the production cost of semiconductor devices since silver is an expensive metal.

SUMMARY OF THE INVENTION

The present invention has been made to eliminate the problems discussed above. It is an object of this invention to provide a method of and an apparatus for manufacturing semiconductor devices which make it possible to produce a semiconductor device having high reliability without plating a lead frame with silver.

In accordance with this invention, a method of manufacturing semiconductor devices includes bonding a semiconductor pellet having electrodes to a die pad on a copper alloy lead frame, which is not silver plated, with a resin, curing the resin by heating it in a non-oxidizing atmosphere having an oxygen concentration of 1,000 ppm or less, reducing the thickness of an oxide film formed on the surface of the lead frame by holding the lead frame in a deoxidizing atmosphere having an oxygen concentration of 550 ppm or less, and wire bonding the electrodes of the semiconductor pellet and leads of the lead frame in a deoxidizing atmosphere having an oxygen concentration of 3,000 ppm or less.

In accordance with this invention, an apparatus for manufacturing semiconductor devices comprises a die bonding means for bonding a semiconductor pellet having electrodes to a die pad on a lead frame, which is not silver plated, with a resin, curing means for curing the resin in a non-oxidizing atmosphere having an oxygen concentration of 1,000 ppm or less, reduction means, directly connected to the curing means, for reducing the thickness of an oxide film formed on the surface of the lead frame in a deoxidizing atmosphere having an oxygen concentration of 550 ppm or less, and a wire bonding means directly connected to the reduction means for wire bonding the electrodes of the semiconductor pellet to the leads of the lead frame in a deoxidizing atmosphere having an oxygen concentration of 3,000 ppm or less.

BRIEF DESCRIPTION OF THE DRAWINGS

FIG. 15 is a graph showing the relationship between the pull strength of a bond, stitch breakage, and the oxygen concentration in the ambient of a lead frame.

DESCRIPTION OF THE PREFERRED EMBODIMENTS

Figure 11:
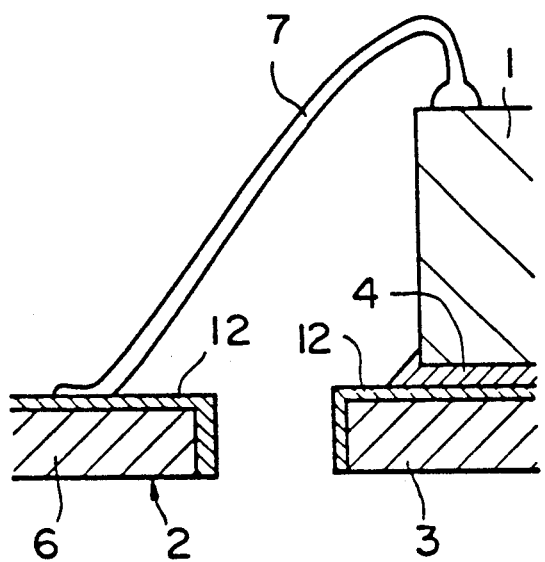
FIGS. 11 and 12 are partial sectional views of semiconductor devices including lead frames with no silver plating.
Figure 12:
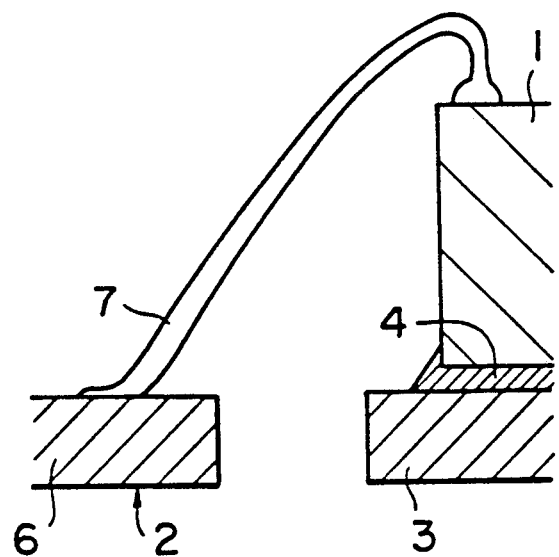

FIGS. 11 and 12 show semiconductor devices are manufactured without silver plated lead frames. As shown in FIG. 11, the die pad 3 and the inner leads 6 of a copper alloy lead frame 2 may be plated with copper 12 or, as shown in FIG. 12, the wire 7 may be directly bonded to the unplated lead frame 2. When, as in the former case, copper plating 12 is present, the production cost is much higher than in the latter case where no plating is present. However, copper is less expensive than silver. Furthermore, since copper is only plated on the surface of a copper alloy lead frame 2, the lead frame material can be selected from a wide choice of hardnesses, alloy compositions, etc.

However, if these methods are adopted in conventional manufacturing processes, an oxide film may be formed as a result of heating in the temperature range of about 150° to 300° C. during thermal curing of die bonding materials and during the wire bonding operation. Thus, in the case of the method shown in FIG. 11, an oxide film is easily formed on the surfaces of the copper plated sections 12 and, in the case of the methods shown in FIG. 12, on the surface of the lead frame 2. When the thickness of this oxide film exceeds a certain value, it is impossible to stably stitch bond the wires 7 to the inner leads 6 of the lead frame 2. In addition, the reliability of the bonds is reduced.

The inventors of this invention conducted experiments under various manufacturing conditions for controlling oxide film thickness.

Figure 13:
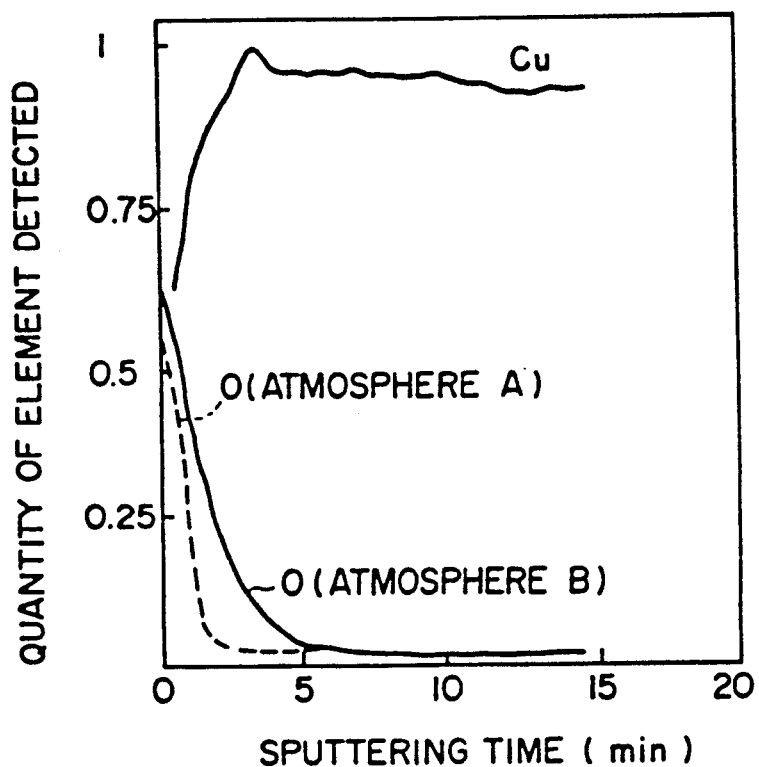
FIG. 13 is a graph showing the results of Auger analysis of a lead frame and an oxide film on the lead frame when the oxygen concentration of the lead frame ambient is changed.
Figure 14:
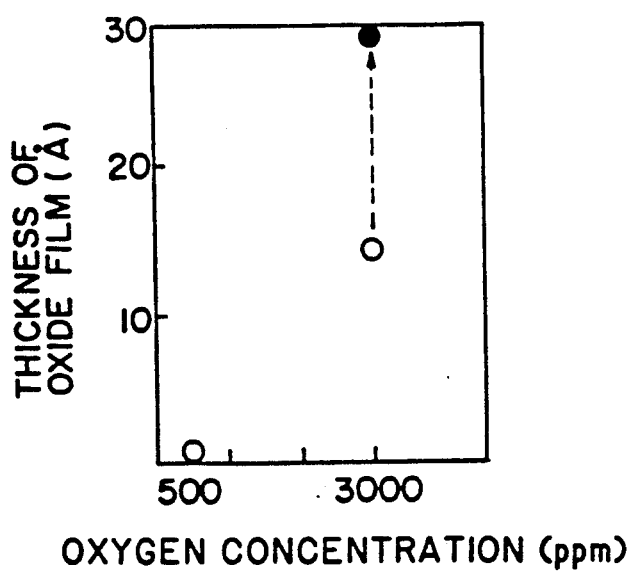
FIG. 14 is a graph showing the relationship between the thickness of an oxide film on a lead frame and the oxygen concentration in the ambient of the lead frame.

First, a plurality of copper plated, copper alloy lead frames were prepared as specimens. Some of the specimens were left to stand in an ambient A having an oxygen concentration of 500 ppm at a temperature of 300° C. for 12 seconds. The rest of the specimens were left to stand in an ambient B having an oxygen concentration of 3,000 ppm at a temperature of 300° C. for 12 seconds. Then, the surfaces of the specimens were subjected to Auger analysis for oxygen content. The analysis results are shown in FIG. 13. The oxide film thickness of each specimen was measured from these analysis results. In the ambient A having an oxygen concentration of 500 ppm, the oxide film thickness was 0.7 Å and, in the ambient B having an oxygen concentration of 3,000 ppm, the oxide film thickness was 14 Å, as indicated by the white dots in FIG. 14. When the same specimens were left to stand in the ambient B for 120 seconds, the thickness of the oxide film was as thick as 20 Å or more, as indicated by the black dot in FIG. 14.

Wire bonding was performed, in a vacuum, on these lead frames on the surfaces on which an oxide film had been thus formed, and the pull strength and the stitch breakage of each bond was measured. FIG. 15 shows the measurement results. It was found from these results that stable bonding could be achieved if the thickness of the oxide film was 20Å or less.

Figure 16:
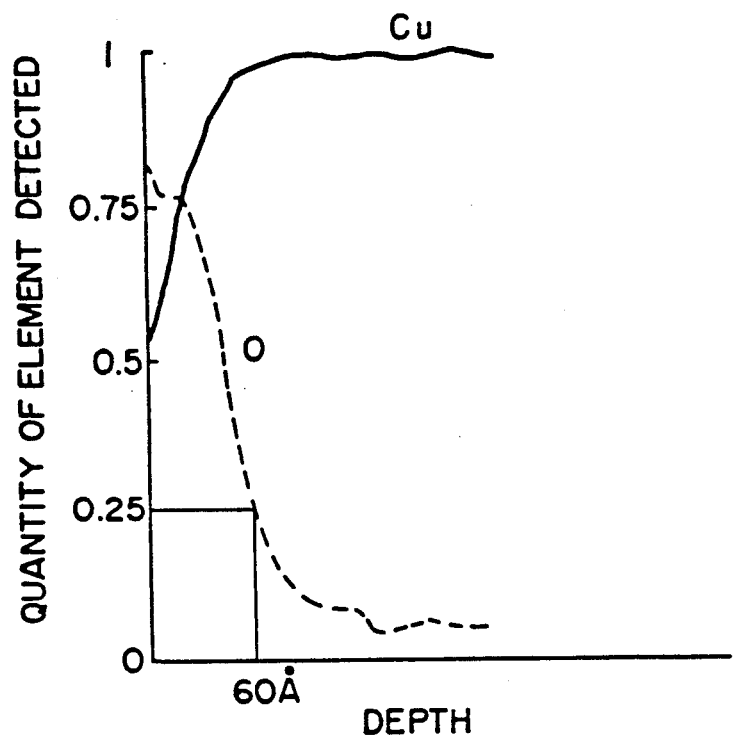
FIGS. 16 and 17 are graphs showing the results of Auger analysis of the lead frame and oxide film on a lead frame immediately after the curing of a die bonding material and on the lead frame after hydrogen reduction of the oxide film, respectively.
Figure 17:
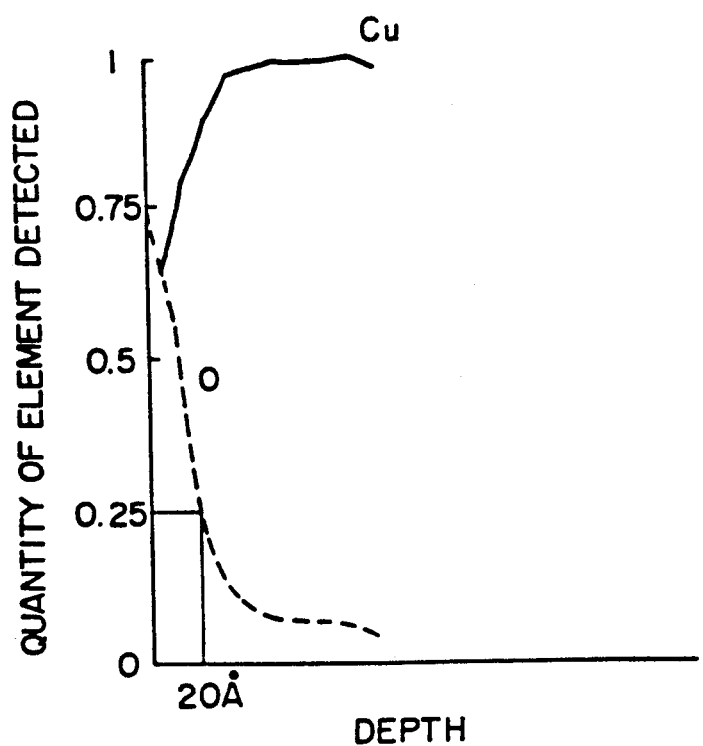

A semiconductor pellet was attached, with a resin material, to a die pad on a copper plated, copper alloy frame. Auger analysis was conducted on the surface of this lead frame immediately after thermal curing the resin material. As shown in FIG. 16, the thickness of the oxide film on the lead frame was about 60 Å. On the other hand, another lead frame, die bonded and cured under the same conditions, was deoxidized in a nitrogen ambient containing hydrogen in a volume ratio of 10% and subjected to Auger analysis. As shown in FIG. 17, the thickness of the oxide film on the lead frame was about 20 Å.

Based on the results of the above experiments, the inventors of the present invention devised a method according to which stable stitch bonding is attained by controlling oxide film formation.

Figure 1:
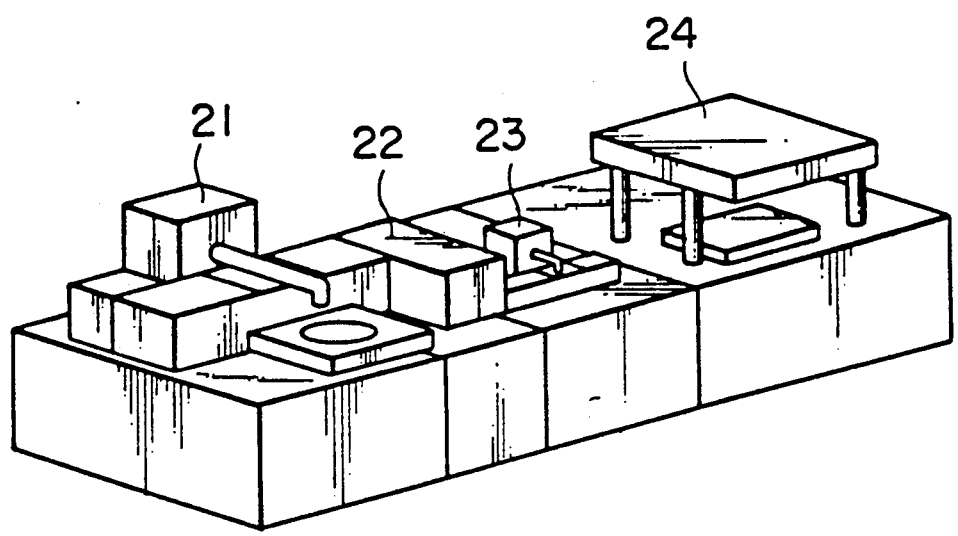
FIGS. 1 and 2 are a perspective view and a plan view, respectively, of an apparatus for manufacturing semiconductors in accordance with an embodiment of the invention.

FIG. 1 shows an apparatus for manufacturing semiconductor devices in accordance with an embodiment of this invention. The apparatus shown successively performs a series of processes, i.e., die bonding, resin curing, and wire bonding, and, at the same time, controls, through these processes, oxide film formation so that the thickness of an oxide film formed on the surface of a lead frame is about 20 Å or less. The apparatus includes a die bonder 21 having a curing furnace 22 for curing a resin die bonding material. Directly connected to the curing furnace 22 is a wire bonder 23 to which a molding device 24 is connected.

Figure 2:
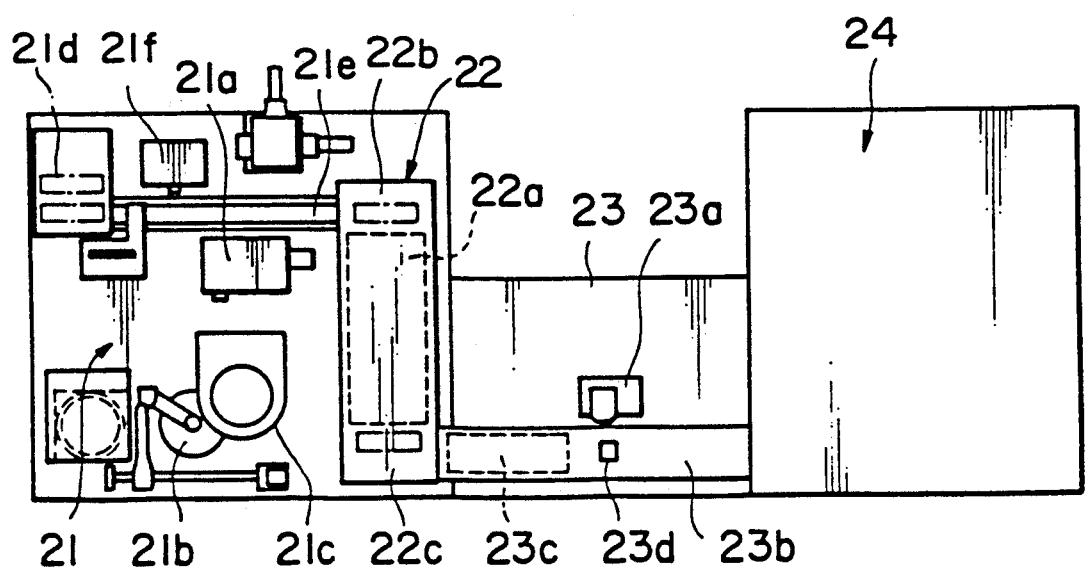

FIG. 2 is a plan view showing this apparatus in more detail. As shown in the drawing, the die bonder 21 includes a die bonding head 21a, a wafer-support section 21c for supporting a semiconductor wafer 21b, a frame feeder 21e for feeding a lead frame 21d, and a dispenser 21f for applying resin material to a die pad.

The curing furnace 22 includes a main curing section 22a equipped with a heating mechanism, such as a heat block, as well as an inlet 22b and an outlet 22c having no heating mechanism. The main curing section 22a, the inlet 22b, and the outlet 22c are separated from each other by air curtains, etc. A non-oxidizing gas is supplied to the curing furnace 22, the oxygen concentration of the ambient being maintained in the main curing section 22a at 1,000 ppm or less.

The wire bonder 23 is equipped with a wire bonding head 23a and a frame feeder 23b for feeding the lead frame 21d. The inlet side of the frame feeder 23b is connected to the outlet 22c of the curing furnace 22, the joining section constituting a reduction section 23c. A deoxidizing gas is supplied to the frame feeder 23b, thereby maintaining the oxygen concentration in the reduction section 23c at 500 ppm or less. However, the frame feeder 23b includes an opening 23d for wire bonding using the wire bonding head 23a so that the oxygen concentration on the surface of the lead frame 21d in the (about 3,000 ppm).

The molding device 24 is equipped with a press (not shown) and a mold (not shown) for molding the lead frame 21d which has been wire bonded using the wire bonder 23.

The die bonder 21 forms the die bonding section, and the wire bonding head 23 forms, together with that section of the frame feeder 23b which is in the vicinity of the opening 23d, the wire bonding section.

Next, the method of manufacturing semiconductor devices using this apparatus will be described.

First, resin material is applied, by means of the dispenser 21f, to the die pad of the lead frame 21d fed by the frame feeder 21e. This lead frame or an unplated copper alloy frame. The die bonding head 21a picks up semiconductor pellets one-by-one from the semiconductor wafer 21b supported by the semiconductor wafer support section 21c and attaches the semiconductor pellets to the die pads of the lead frames 21d to which a resin material has already been applied. This process is conducted at room temperature without heating the lead frames 21d.

Figure 3:
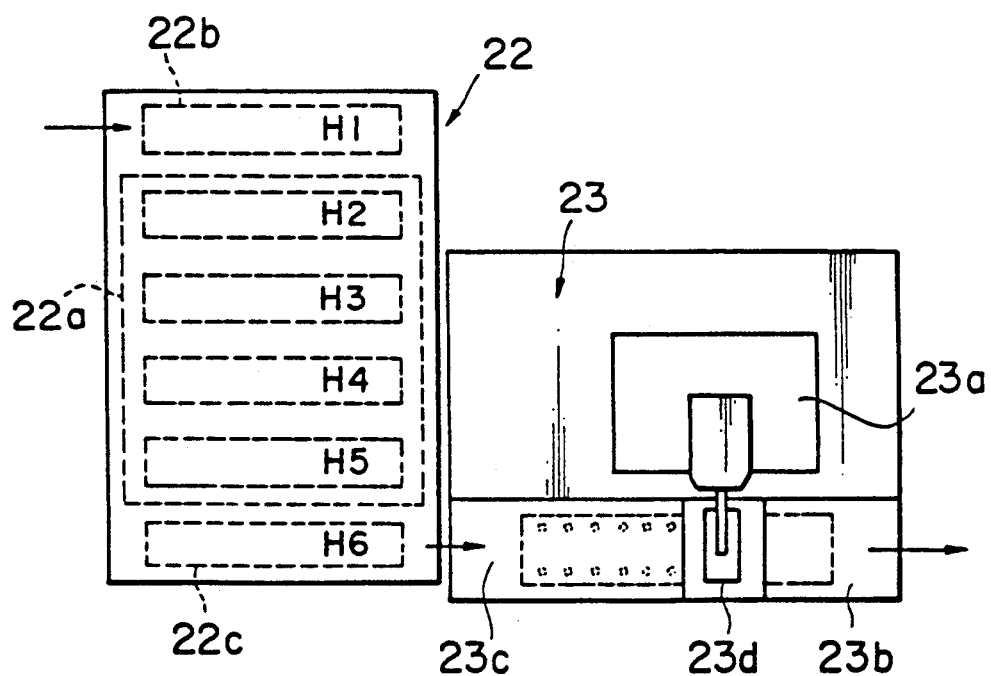
FIG. 3 is a plan view showing the curing furnace and the wire bonding section of the embodiment of FIGS. 1 and 2.

The lead frames 21d to which semiconductor pellets have been thus attached are conveyed, one-by-one, to the curing furnace 22. As shown in FIG. 3, the curing furnace 22 is capable of accommodating six lead frames 21d in its sections H1 to H6. The sections H1 to H6, which correspond to the inlet 22b and the outlet 22c, are at room temperature, no heating mechanism being provided in these sections. By contrast, the main curing section 22a is equipped with a heating block, the temperature in the four sections H2 to H5 being set at around 200° C. The lead frame 21d, conveyed from the die bonder 21, enters the section H1 of the curing furnace 22 and is then successively transferred through the sections H2 to H5 where the resin material is thermally cured. The lead frame 21d with cured resin material is transferred to the section H6 which corresponds to the outlet 22b where it is cooled before it is conveyed to the wire bonder 23. The length of time each lead frame 21d is allowed to stay in the curing furnace 22 is 120 seconds. Nitrogen, a non-oxidizing gas, is supplied to the curing furnace 22. As stated above, the oxygen concentration in the main curing section 22a is kept at 1,000 ppm or less. As a result, the thickness of the oxide films formed on the surfaces of the lead frames 21d conveyed to the wire bonder 23 is kept to 50 Å or less.

Figure 4:
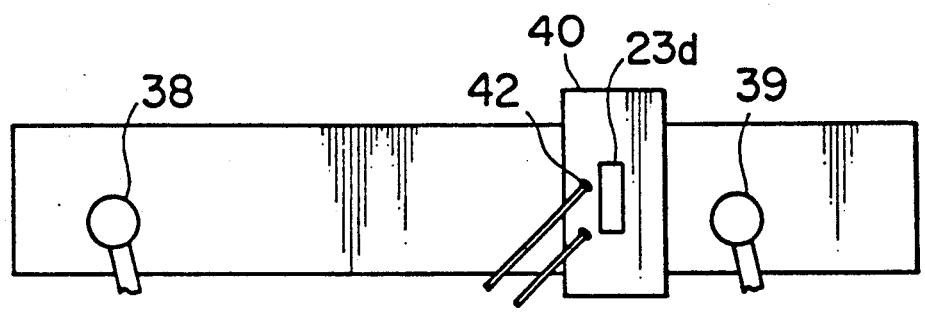
FIGS. 4 and 5 are a plan view and a sectional view, respectively, of the wire bonder of the embodiment of FIGS. 1 and 2.
Figure 5:
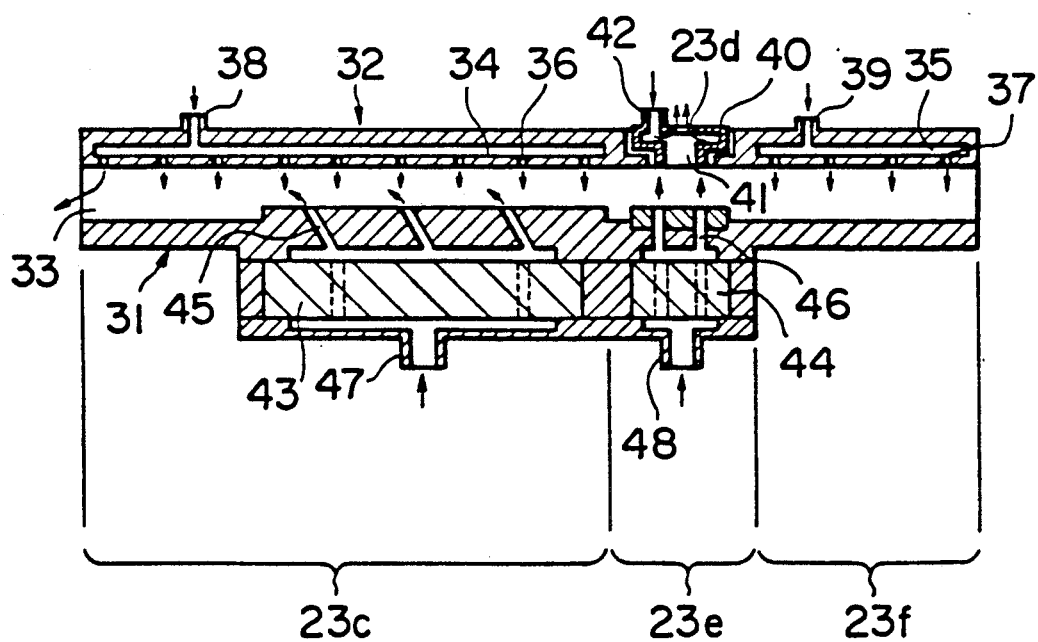
Figure 6:
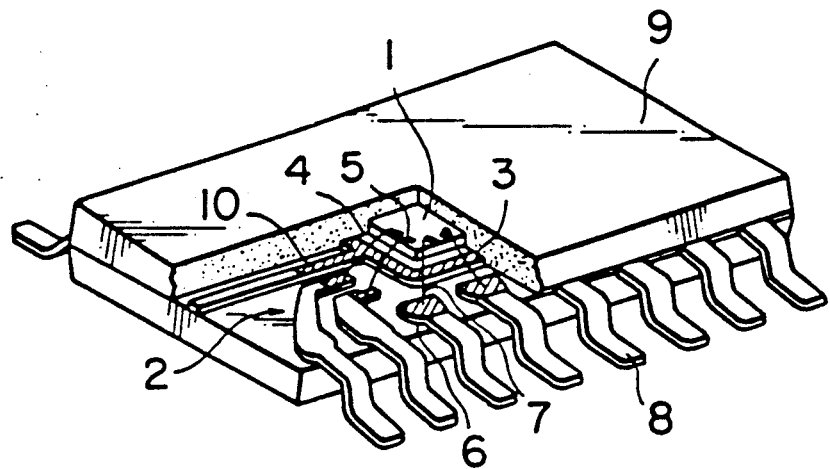
FIGS. 6 and 7 are a perspective view, with a part broken away, and a sectional view, respectively, of a semiconductor device manufactured in accordance with a conventional method.
Figure 7:
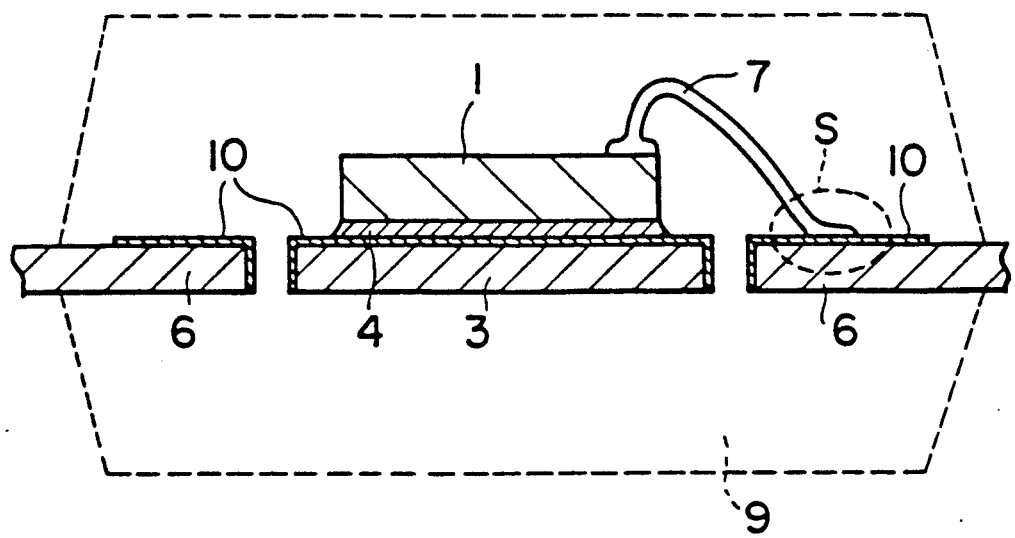
Figure 8:
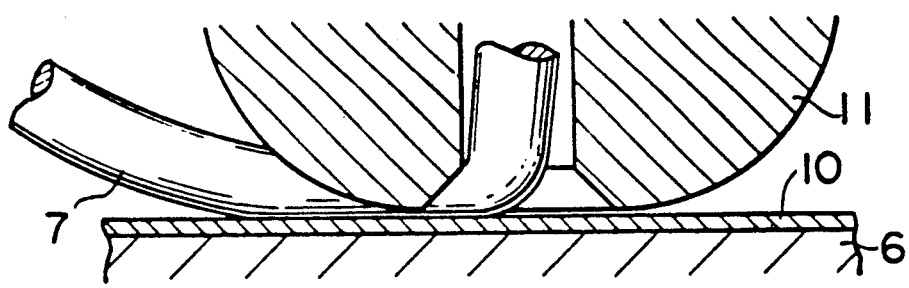
FIGS. 8 and 9 are a sectional view and a plan view, respectively, of a stitch-bonded section of the semiconductor device shown in FIGS. 6 and 7.
Figure 9:
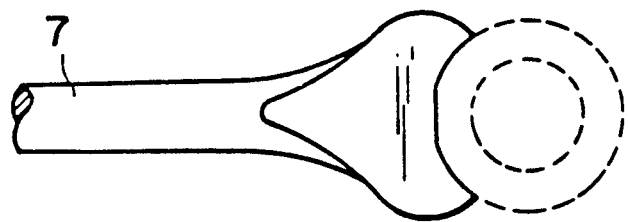
Figure 10:
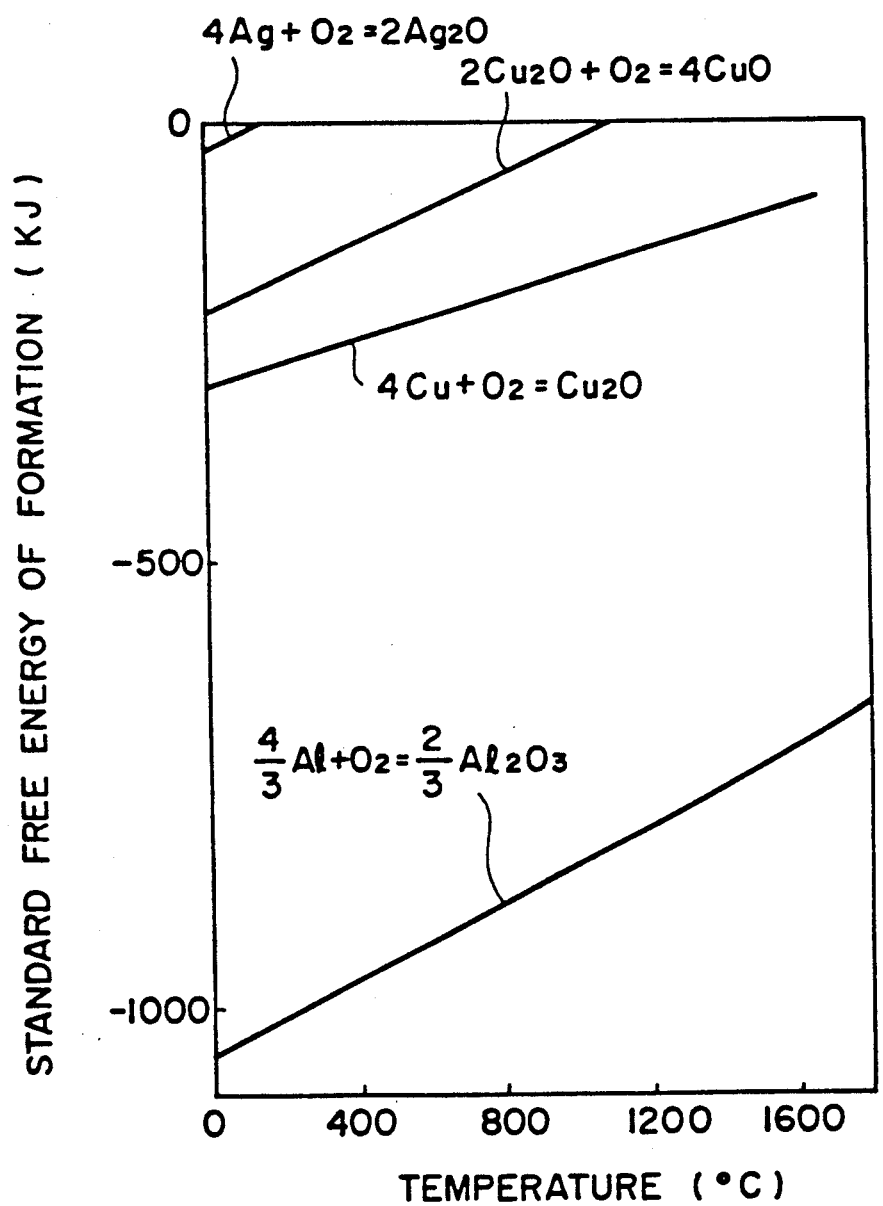
FIG. 10 is a graph showing the relationship between the standard free energy of oxide formation and temperature for various metallic oxides.

Afterwards, the lead frame 21d enters the frame feeder 23b of the wire bonder 23. FIGS. 4 and 5 are a plan view and a sectional view, respectively, of this frame feeder 23b. The frame feeder 23b is functionally divided into three sections: a reduction section 23c, a wire bonding section 23e, and an after-heating section 23f. Further, the frame feeder 23b is equipped with a heat block 31 and a cover 32 which is arranged over the heat block 31. A space 33 for receiving the lead frames 21d is defined by the heat block 31 and the cover 32.

The section of the cover 32 corresponding to the reduction section 23c and that corresponding to the after-heating section 23f are equipped with hollow sections 34 and 35, respectively. A plurality of injection ports 36 and 37 for injecting a deoxidizing gas into the space 33 are provided for communicating with these hollow sections 34 and 35. Formed on the top section of the cover 32 are gas supply ports 38 and 39, respectively communicating with the hollow sections 34 and 35. A frame-fixing member 40 having an opening 23d is provided in the wire bonding section 23e of the cover 32. This frame-fixing member 40 has a hollow section 41 communicating with the opening 23d and is equipped with a gas supply port 42 communicating with the hollow section 41. When a deoxidizing gas is supplied through this gas supply port 42 to the hollow section 41, the gas is blown upwards through the opening 23d.

The heat block 31 includes heaters 43 and 44 embedded in those sections corresponding to the reduction section 23c and the wire bonding section 23e, respectively. With this arrangement, temperature setting can be separately effected in the reduction section 23c and the wire bonding section 23e, thereby allowing the top surface of the heat block 31 to have a uniform temperature profile. As a result, the reduction section 23c also functions as a preheating section for preheating the lead frame 21d prior to wire bonding. A plurality of injection ports 45 and 46 for injecting a deoxidizing gas into the space 33 are provided in those sections of the heat block 31 corresponding to the reduction section 23c and the wire bonding section 23e, respectively. Further, gas supply ports 47 and 48 communicate with the injection ports 45 and 46, respectively.

The gas supply ports 38, 39, 42, 47, and 48 are connected to a gas supply apparatus (not shown) which supplies nitrogen containing 10% hydrogen by volume as the deoxidizing gas. This arrangement allows the oxygen concentration in the reduction section 23c to be kept at 500 ppm or less and the oxygen concentration around the surface of the lead frame 21d when it is near the wire bonding section 23e to be kept at 3,000 ppm or less.

Before being transferred from the curing furnace 22 to the wire bonding section 23e, the lead frame 21d is preheated in the reduction section 23c and, at the same time, the thickness of the oxide film on the surface of the lead frame 21d is reduced to 20 Å or less. Afterwards, the lead frame 21d is transferred to the wire bonding section 23e where wire bonding between the electrodes of the semiconductor pellet and the inner leads is performed by the wire bonding head 23a through the opening 23d. This wire bonding is conducted in 12 seconds or less for each semiconductor pellet. The reason for thus limiting the operation time is that the oxygen concentration around the surface of the lead frame 21d when positioned in the wire bonding section 23e is relatively high (almost 3,000 ppm) so that the thickness of the oxide film is likely to exceed a predetermined value if the frame is allowed to stand in the wire bonding section too long. If the operation time for wire bonding exceeds 12 seconds, the semiconductor pellet concerned is discarded as a defective product.

When the wire bonding has been completed in the wire bonding section 23e, the lead frame 21d is transferred through the after-heating section 23f to the molding device shown in FIGS. 1 and 2 wherein it is encapsulated, such as in plastic.

Thus, in accordance with this embodiment, a copper lead frame with no silver plating can be used which reduces material cost. Bonding gold wires to a copper plated lead frame allows the bonding section to enjoy a longer service life since the intermetal diffusion between gold and copper progresses much more slowly than that between gold and silver. In addition, the continuous manufacturing process stabilizes product quality and reduces labor.

By integrally forming the curing furnace 22 and the frame feeder 23b of the wire bonder 23, the ambient of the lead frame 21d in the joining section between these components can be controlled, thus providing a further improvement in anti-oxidization measures.

In the described embodiment, the transfer direction of the lead frame 21d in the curing furnace 22 differs from that in the die bonder 21 and the wire bonder 23, an arrangement suited for stripe-like lead frames 21d. By designing the apparatus so that the lead frame 21d is constantly transferred in the longitudinal direction thereof, continuous production of semiconductor devices can be realized even when hoop-like lead frames 21d are employed.

What is claimed is:

1. A method of manufacturing semiconductor devices comprising:
bonding a semiconductor pellet having electrodes to a die pad of an unplated copper-alloy lead frame with a resin;
curing said resin by heating said lead frame, resin, and semiconductor pellet in a non-oxidizing atmosphere having an oxygen concentration of no more than 1000 ppm;

reducing the thickness of an oxide film formed on the surface of said lead frame during the curing of said resin in a deoxidizing atmosphere having an oxygen concentration of no more than 500 ppm;

transferring said lead frame with the reduced thickness oxide film to a deoxidizing atmosphere having an oxygen concentration at the surface of said lead frame of no more than 3000 ppm; and wire-bonding wires between said electrodes of said semiconductor pellet and leads of said lead frame within 12 seconds of transfer of said lead frame to the deoxidizing atmosphere having an oxygen concentration at the surface of said lead frame of no more than 3000 ppm.

2. A method as claimed in claim 1 wherein said non-oxidizing gas is nitrogen.

3. A method as claimed in claim 1 wherein said deoxidizing gas is a mixture of hydrogen and nitrogen.

4. A method as claimed in claim 1 including limiting the thickness of the oxide film on the surface of said lead frame during curing of said resin to no more than 50Å or less.

5. A method as claimed in claim 1 including curing said resin for no more than 120 seconds.

6. A method as claimed in claim 1 including reducing the thickness of the oxide film to no more than 20Å.

7. A method of manufacturing semiconductor devices comprising:

plating the surface of a copper-alloy lead frame with copper;

bonding a semiconductor pellet having electrodes to the copper plating on a die pad of said plated lead frame with a resin;

curing said resin by heating said lead frame, said resin, and said semiconductor pellet in a non-oxidizing atmosphere having an oxygen concentration of no more than 1000 ppm;

reducing the thickness of an oxide film formed on said plated lead frame during the curing of said resin in a deoxidizing atmosphere having an oxygen concentration of no more than 500 ppm;

transferring said plated lead frame with the reduced thickness oxide film to a deoxidizing atmosphere having an oxygen concentration at the surface of said plated lead frame of no more than 3000 ppm; and wire-bonding wires between said electrodes of said semiconductor pellet and leads of said plated lead frame within 12 seconds of transfer of said plated lead frame to the deoxidizing atmosphere having an oxygen concentration at the surface of said plated lead frame of no more than 3000 ppm.

8. A method as claimed in claim 7 wherein said non-oxidizing gas is nitrogen.

9. A method as claimed in claim 7 wherein said deoxidizing gas is a mixture of hydrogen and nitrogen.

10. A method as claimed in claim 7 including limiting the thickness of the oxide film on the surface of said plated lead frame during curing of said resin to no more than 50Å.

11. A method as claimed in claim 7 including curing said resin for no more than 120 seconds.

12. A method as claimed in claim 7 including reducing the thickness of the oxide film to no more than 20Å.

* * * * *